(12) United States Patent
Du Plessis

(10) Patent No.: US 8,669,564 B2
(45) Date of Patent: Mar. 11, 2014

(54) LIGHT EMITTING DEVICE WITH ENCAPSULATED REACH-THROUGH REGION

(75) Inventor: Monuko Du Plessis, Pretoria (ZA)

(73) Assignee: Insiava (Pty) Limited, Hillcrest (ZA)

( * ) Notice: Subject to any disclaimer, the term of this patent is extended or adjusted under 35 U.S.C. 154(b) by 88 days.

(21) Appl. No.: 13/139,653

(22) PCT Filed: Nov. 26, 2009

(86) PCT No.: PCT/IB2009/055362
§ 371 (c)(1),
(2), (4) Date: Sep. 23, 2011

(87) PCT Pub. No.: WO2010/070509
PCT Pub. Date: Jun. 24, 2010

(65) Prior Publication Data
US 2012/0001681 A1  Jan. 5, 2012

(30) Foreign Application Priority Data

Dec. 15, 2008  (ZA) .................................. 2008/10604
Jan. 20, 2009  (WO) .................. PCT/IB2009/050194

(51) Int. Cl.
*H01L 33/62*  (2010.01)

(52) U.S. Cl.
USPC ........................................................ 257/79

(58) Field of Classification Search
USPC .............. 257/1–3, 79–81, 98–99; 438/22, 46
See application file for complete search history.

(56) References Cited

U.S. PATENT DOCUMENTS

| | | | |
|---|---|---|---|
| 5,994,720 A | 11/1999 | Snyman et al. | |
| 6,111,271 A | 8/2000 | Snyman et al. | |
| 7,187,023 B2 * | 3/2007 | Yoshihara | 257/292 |
| 7,214,971 B2 * | 5/2007 | Niigaki et al. | 257/184 |
| 7,728,340 B2 * | 6/2010 | Unno et al. | 257/98 |
| 7,732,301 B1 * | 6/2010 | Pinnington et al. | 438/455 |
| 8,154,037 B2 * | 4/2012 | Kadotani et al. | 257/97 |

(Continued)

FOREIGN PATENT DOCUMENTS

| | | |
|---|---|---|
| WO | WO 02/097894 | 12/2002 |
| WO | 2009/093170 | 7/2009 |

OTHER PUBLICATIONS

International Search Report for PCT/IB2009/055362, mailed Apr. 7, 2010.

(Continued)

*Primary Examiner* — Nathan Ha
(74) *Attorney, Agent, or Firm* — Nixon & Vanderhye PC

(57) ABSTRACT

A light emitting device (10) comprises an elongate first body (12) of a semiconductor material. A transverse junction (18) is formed in the first body between a first n+-type region (12.1) of the first body and a second p-type region (12.2). A third p+-type region (12.3) is spaced from the first region by the second region. A second body (22) of an isolation material is provided immediately adjacent at least part of the second region to at least partially encapsulate the first body. A terminal arrangement (28) is connected to the first body and is arranged to reverse bias the junction (18) into a breakdown mode. The device is configured such that a depletion region associated with the junction (18) extends through the second region (12.2) and reaches the third region (12.3) before the junction (18) enters the breakdown mode.

15 Claims, 5 Drawing Sheets

(56) References Cited

U.S. PATENT DOCUMENTS

| | | |
|---|---|---|
| 8,217,417 B2 * | 7/2012 | Pan et al. .................. 257/99 |
| 8,242,548 B2 * | 8/2012 | Takizawa .................. 257/294 |
| 8,362,679 B2 | 1/2013 | Du Plessis |
| 8,395,226 B2 | 3/2013 | Du Plessis et al. |
| 2007/0145394 A1 | 6/2007 | Shimizu et al. |
| 2011/0031893 A1 | 2/2011 | Snyman et al. |
| 2011/0042701 A1 | 2/2011 | Du Plessis et al. |
| 2011/0068716 A1 | 3/2011 | Snyman et al. |
| 2012/0009709 A1 | 1/2012 | Du Plessis |
| 2013/0026534 A1 | 1/2013 | Venter |

OTHER PUBLICATIONS

International Preliminary Report on Patentability for PCT/IB2009/055362, dated Oct. 13, 2010.

Balucani, M. et al., "Characterization if silicon LEDs integrated with oxidized porous silicon SOI", Microelectronic Engineering, vol. 36, No. 1-4, (Jun. 1, 1997), pp. 115-118.

Du Plessis, M. et al., "Two- and Multi-terminal CMOS/BiCMOS Si LED's", Optical Materials, vol. 27, No. 5, (Feb. 1, 2005), pp. 1059-1063.

Hoang, T. et al., "Strong Efficiency Improvement of SOI-LEDs Through Carrier Confinement", IEEE Electron Device Letters, vol. 28, No. 5, (May 1, 2007), pp. 383-385.

Hoang, T. et al., "SOI-LEDs with Carrier Confinement" Materials Science, vol. 590, (Aug. 2008), pp. 101-116.

Snyman, L.W. et al.., "Higher Efficiency Silicon CMOS Light Emitting Devices Using Current Density and Carrier Injection Techniques", Proceedings of the SPIE—The International Society for Optical Engineering, vol. 5730, (Mar. 14, 2005), pp. 59-72.

Aharoni, H. et al., "A Dependency of Quantum Efficiency of Silicon CMOS n+pp+ LEDs on Current Density", IEEE Photonics Technology Letters, vol. 17, No. 10, (Oct. 1, 2005), pp. 2041-2043.

U.S. Appl. No. 13/810,809 (Du Plessis et al.), filed Apr. 1, 2013.

U.S. Appl. No. 13/574,333 (Venter, Petrus Johannes), filed Jul. 20, 2012.

U.S. Appl. No. 13/161,113 (Du Plessis), filed Jun. 15, 2011.

U.S. Appl. No. 12/865,609 (Snyman et al.), filed Jul. 30, 2010.

U.S. Appl. No. 12/863,743 (Snyman et al.), filed Jul. 20, 2010.

U.S. Appl. No. 12/740,597 (Du Plessis et al.), filed Oct. 20, 2010.

English language translation of Japanese Patent Office Action Patent in corresponding Japanese Patent Application No. 2011-540278, Drafting Date Oct. 18, 2013 (Dispatch date: Oct. 24, 2013).

* cited by examiner

LIGHT EMITTING DEVICE WITH ENCAPSULATED REACH-THROUGH REGION

This application is the U.S. national phase, under 35 U.S.C. §371, of International Application No. PCT/IB2009/055362, filed 26 Nov. 2009, which claims priority to South Africa Application No. 2008/10604, filed 15 Dec. 2008; and IB Application No. PCT/IB2009/050194, filed 20 Jan. 2009, the entire contents of each of which are hereby incorporated herein by reference.

INTRODUCTION AND BACKGROUND

This invention relates to optoelectronic devices and more particularly to a light emitting device fabricated from an indirect bandgap semiconductor material and to a method of generating light.

Avalanche electroluminescent light emission in single crystal indirect bandgap semiconductors (e.g. silicon) is generated by the interaction between mobile hot carriers (e.g. recombination of electrons and holes) and lattice phonons in reverse biased pn junctions.

In conventional reversed biased $n^+p$ junctions in silicon devices, carriers experience impact ionization over a short distance only in the depletion region. A low electric field at the end of the p side remote from the junction means that hot or energetic carriers are only present at the $n^+$ side of the depletion region and that holes leaving the depletion region at the opposite side thereof will be low energy carriers. If the carrier recombination rate is proportional to the product $p^*n$ of the hole p and the electron n concentrations, carrier recombination will occur in a short region of the depletion region only. These features and parameters, together with the fact that in the known devices a major part of the sidewalls of the depletion region is bordered by bulk semiconductor material, contribute to an internal quantum efficiency, which is not satisfactory.

OBJECT OF THE INVENTION

Accordingly it is an object of the present invention to provide an alternative light emitting device and an alternative method of generating light with which the applicant believes the aforementioned disadvantages may at least be alleviated or which may provide useful alternatives for the known devices and methods.

SUMMARY OF THE INVENTION

According to the invention there is provided a light emitting device comprising:
a first body of a semiconductor material;
a junction in the first body formed between a first region of the first body and a second region of the first body, the first region being of a first doping kind of a first concentration and the second region being of a second doping kind of a second concentration;
the first body comprising a third region of the second doping kind of a third concentration, and being spaced from the first region by the second region, so that the second region is sandwiched between the first region and the third region;
a second body of an isolation material immediately adjacent at least part of the second region, the second body at least partially encapsulating the first body, so that when the device is viewed in transverse cross section, the second body at least partially borders spaced sides of the second region of the first body, or at least partially encircles at least part of the second region of the first body;
a terminal arrangement connected to the first body and arranged to reverse bias the junction into a breakdown mode; and
the device being configured such that a depletion region associated with the junction extends through the second region of the first body and reaches the third region of the first body, before the junction enters the breakdown mode.

The first and third doping concentrations may be higher than the second doping concentration.

The second body may wholly encircle or circumscribe the junction and at least part of the second region of the first body. In a preferred form of the invention, the whole of the first body is encapsulated by the second body.

The semiconductor material may be an indirect bandgap semiconductor material. Preferably the material comprises silicon.

The insulating material may comprise silicon dioxide.

The first doping kind may be n and the second doping kind may be p. In other embodiments the first doping kind may be p and the second doping kind may be n.

The terminal arrangement may be connected to the first region of the first body and the third region of the first body only.

The device may have a lateral layout with the first, second and third regions of the first body laterally in line and all adjacent a light emitting wall of the device.

According to another aspect of the invention there is provided a method of generating light comprising the steps of:
providing a device comprising a first body of a semiconductor material having a junction formed in the body between a first region of the body and a second region of the body, the first region being of a first doping kind of a first concentration and the second region being of a second doping kind of a second concentration, the first body comprising a third region of the second doping kind of a third concentration spaced from the first region of the first body by the second region, so that the second region is sandwiched between the first region and the third region of the first body; and a second body of an isolation material immediately adjacent at least part of the second region, the second body at least partially encapsulating the first body, so that when the device is viewed in transverse cross section, the second body at least partially borders spaced sides of the second region of the first body, or at least partially encircles at least part of the second region of the first body; and
reverse biasing the junction such that a depletion region associated with the junction extends through the second region of the first body and reaches the third region of the first body, before the junction enters the breakdown mode.

The junction may be reverse biased by applying a biasing voltage to the first region of the first body and the third region of the first body only.

BRIEF DESCRIPTION OF THE ACCOMPANYING DIAGRAMS

The invention will now further be described, by way of example only, with reference to the accompanying diagrams wherein.

Figure 1:
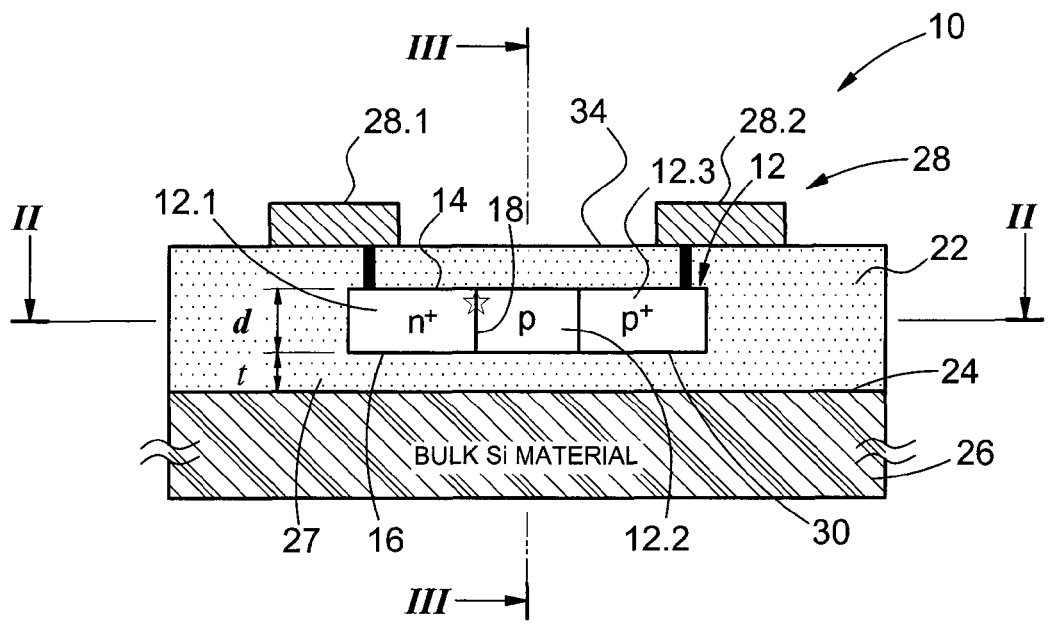
FIG. 1 is a cross section through a first embodiment of a light emitting device fabricated from an indirect bandgap semiconductor material.

FIGS. 10(a) to (d) are diagrams illustrating various features and parameters of a conventional n+p silicon junction in avalanche; and FIGS. 11(a) to (d) are corresponding diagrams for a device according to the invention.

DESCRIPTION OF A PREFERRED EMBODIMENT OF THE INVENTION

A light emitting device fabricated from a semiconductor material, preferably an indirect bandgap semiconductor material, such as Si, Ge and Si—Ge, is generally designated by the reference numeral 10 in FIGS. 1 to 9 and 11.

The device comprises a first body 12 of the indirect bandgap semiconductor material, in this case single crystal or monolithic Si. The first body may have any suitable shape in transverse cross section, such as circular or rectangular. In the embodiment shown in FIGS. 1 to 3, it is rectangular. More particularly, the first body has a thickness dimension d and in relevant parts thereof has a width dimension w, and has a first or top wall 14, a second or bottom wall 16 and sidewalls 32, shown in FIG. 2. The first body provides a junction 18 between a first region 12.1 of the body of a first doping kind of a first doping concentration and a second region 12.2 of the first body of a second doping kind and of a second doping concentration. The first body further comprises a third region 12.3 of the second doping kind and of a third doping concentration.

The first doping kind is n and the second doping kind is p. The first doping concentration and the third doping concentration are preferably higher than the second doping concentration. In other embodiments, opposite doping kinds may be used.

As shown in FIG. 1 the first junction extends transversely in the first body 12 between the top wall 14 and the bottom wall 16. The device layout is lateral and the first, second and third regions are in line, with the second region sandwiched between the first and third regions. The aforementioned regions are immediately adjacent a light transmitting top wall 34 of the device 10.

Figure 2:
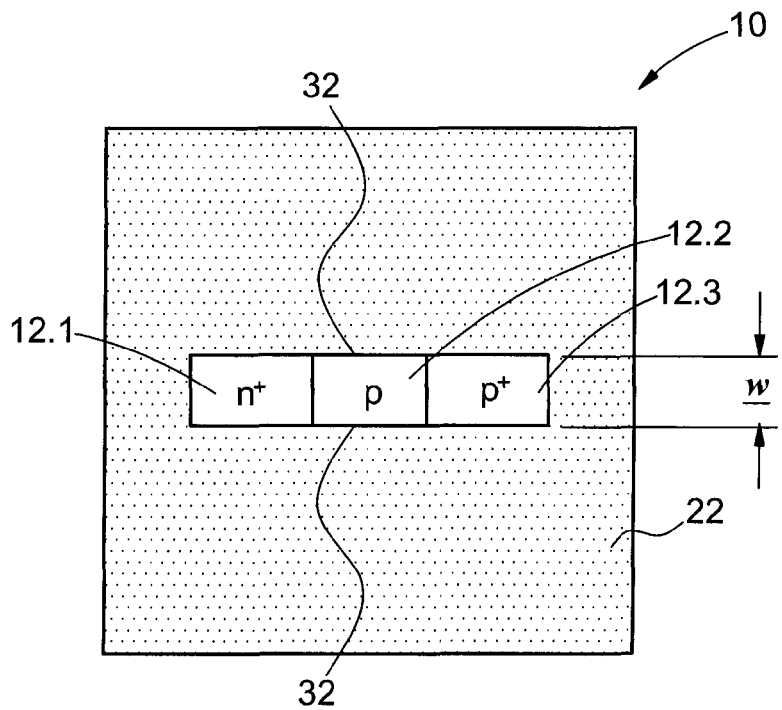
FIG. 2 is a section on line II in FIG. 1.
Figure 3:
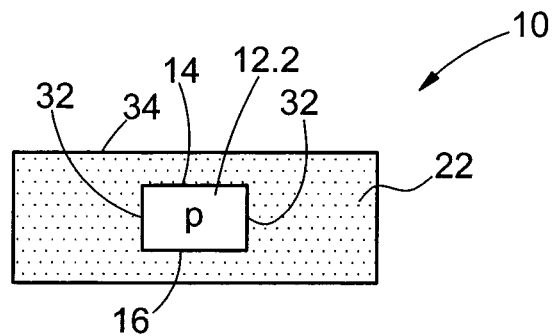
FIG. 3 is a section on line III in FIG. 1.
Figure 4:
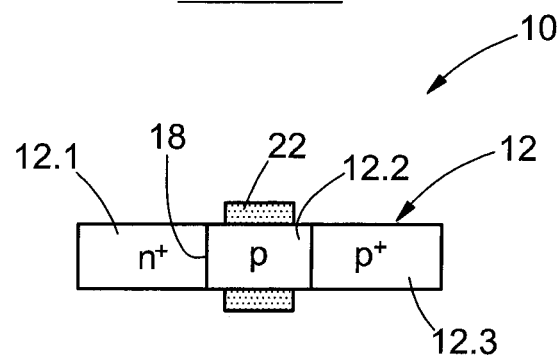
FIG. 4 is a view similar to FIG. 2 of relevant parts of a second embodiment of the device.

At least two, preferably more than two of top wall 14, bottom wall 16, and sidewalls 32 of at least the second region 12.2 are bordered or terminated by a second body 22 of a translucent, preferably transparent, isolation material, such as silicon dioxide, located immediately adjacent the relevant wall(s). In a preferred embodiment, as shown in FIGS. 1 to 3, the first body 12 is encapsulated in the second body 22. The whole of the first body 12 may be so encapsulated in the second body 22 utilizing so-called Silicon on isolator (SOI) Complementary Metal Oxide Semiconductor (CMOS) technology. The second body is provided on a surface 24 of bulk silicon 26. A buried silicon dioxide wall 27 with thickness spaces the bottom wall 16 of the first body 12 from the bulk material. Hence, the so terminated parts of at least the second region 12.2 do not have a wall to the bulk semiconductor material, because the sidewalls are terminated by the second body of isolation material.

Suitable electrical contacts 28.1 and 28.2 of a terminal arrangement 28 are connected to the first region 12.1 and third region 12.3, respectively. No contact is required to the second region 12.2. In use, the junction 18 is reverse biased into a light generating breakdown mode which may be avalanche or field emission mode or a combination of both. However, the device is configured such that a depletion region associated with the junction 18 traverses or extends through the second region 12.2 and reaches the third region 12.3, before the junction 18 enters the breakdown mode.

Figure 5:
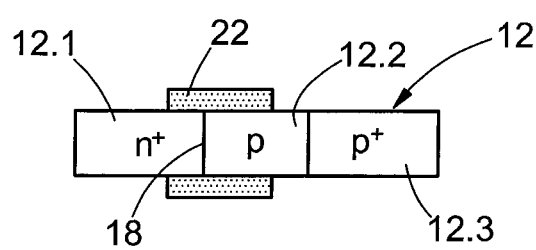
FIG. 5 is a view similar to FIG. 2 of relevant parts of a third embodiment of the device.
Figure 6:
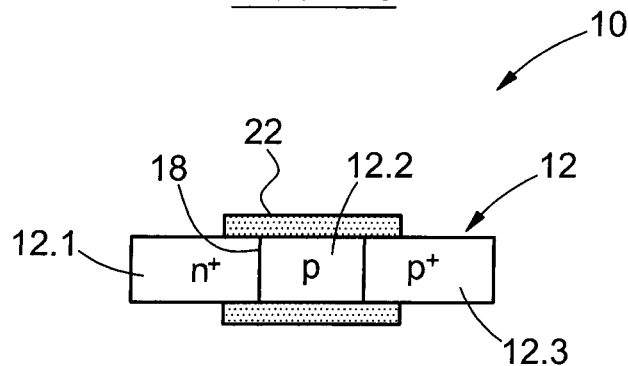
FIG. 6 is a view similar to FIG. 2 of relevant parts of a fourth embodiment of the device.
Figure 7:
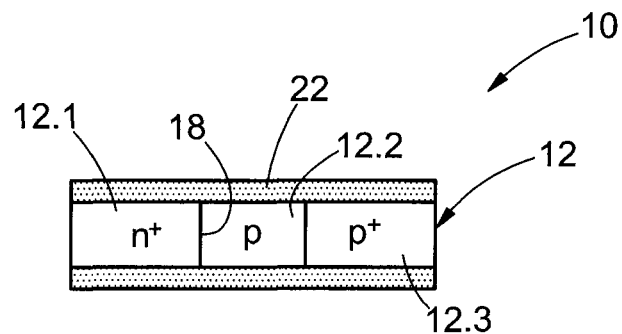
FIG. 7 is a view similar to FIG. 2 of relevant parts of a fifth embodiment of the device.

In FIGS. 4 to 7 there are shown various embodiments of the device 10 wherein different parts of the first body 12 are bordered or cladded by the second body as hereinbefore described. In the embodiment in FIG. 4, only part of the second region 12.2 is circumscribed by coaxial second body 22. In the embodiment of FIG. 5, the junction 18 and at least part of the second region 12.2 are so circumscribed. In the embodiment of FIG. 6, part of the first region 12.1, the junction 18, the whole of the second region 12.2 and part of the third region 12.3 are so circumscribed. In the embodiment in FIG. 7 the whole of the sidewalls of the first, second and third regions are so circumscribed.

Figure 8:
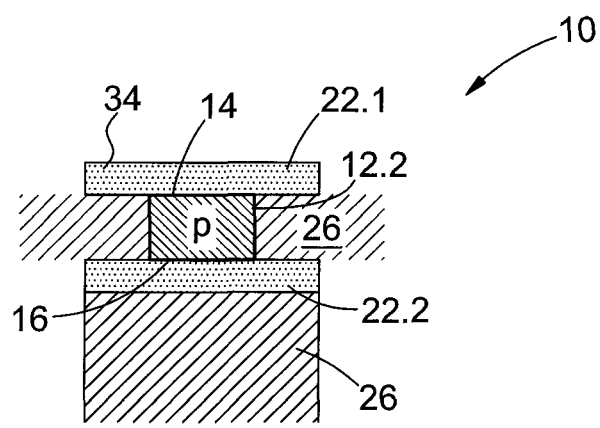
FIG. 8 is a view similar to FIG. 3 of relevant parts of a sixth embodiment of the device.

In the embodiment in FIG. 8, spaced peripheral regions, more particularly opposite sides, of the first body 12 in the form of top wall 14 and spaced bottom wall 16 of at least part of the second region 12.2 are bordered by respective bodies 22.1 and 22.2 of the isolation material. In a preferred form of this embodiment, the first body 12 is sandwiched between the bodies 22.1 and 22.2, so that top wall 14 of the first body 12 is spaced from top wall 34 of the device 10 by body 22.1 and the bottom wall 16 of the first body 12 is spaced from the bulk material 26 by buried layer 22.2.

Figure 9:
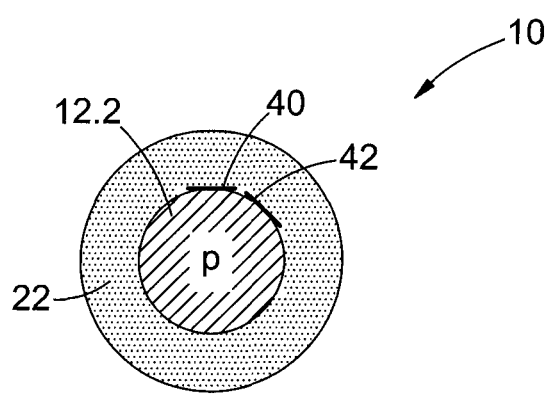
FIG. 9 is a view similar to FIG. 3 of relevant parts of a seventh embodiment of the device.

In the embodiment shown in FIG. 9, the first body is circular in transverse cross section. The second body 22 may comprise a circle segment (not shown) or an annular sleeve with a circular inner wall, so that when the device is viewed in transverse cross section, the second body at least partially embraces or encircles at least part of the second region 12.2 of the first body.

The second body 22 confines carriers moving through the second region 12.12, such that all carriers moving through junction 18 will be confined to region 12.2, with carrier recombination in region 12.2 and carriers not recombining, eventually reaching the third region 12.3.

Figure 10:
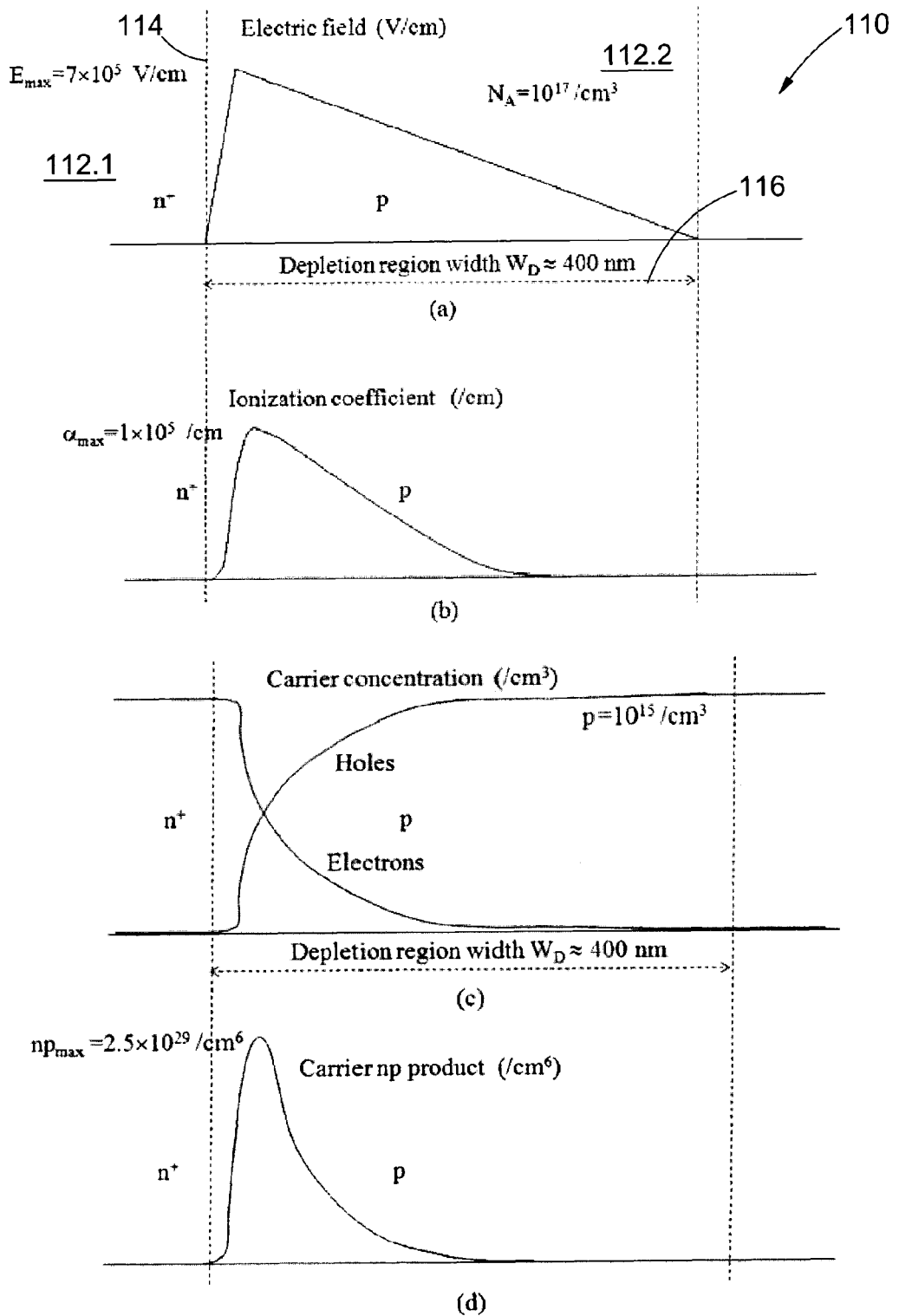
Figure 11:
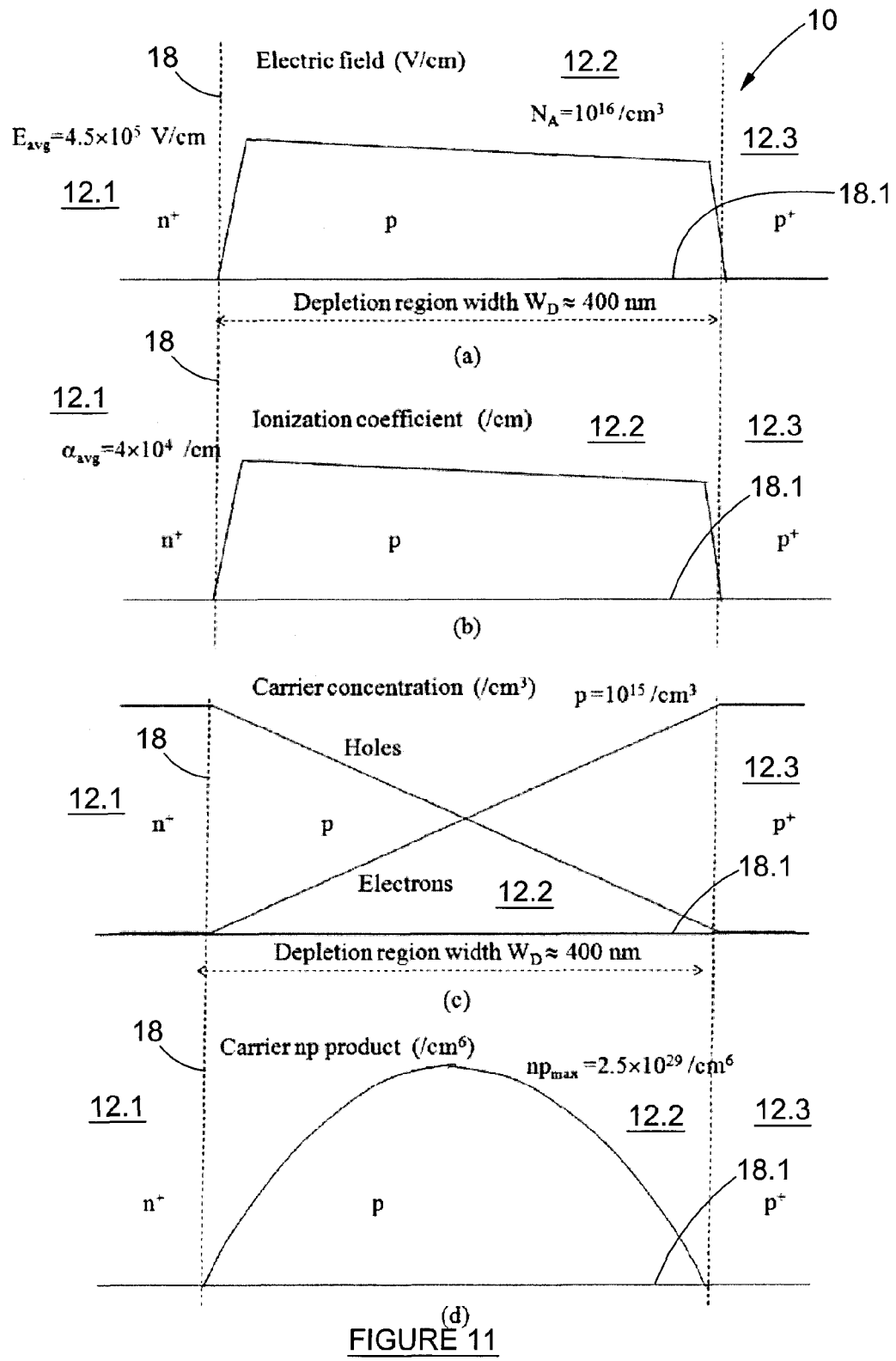

Referring now to a conventional or prior art n+p junction silicon device 110 shown in FIGS. 10(a) to 1(d) where there are respectively shown the conventional electric field, electron avalanche ionization coefficient, carrier concentrations and carrier pn product profiles at the avalanching operating point. Typical values are also shown in the figures. The dimensions given are for a typical n+p junction silicon device 110 with a low doped p region 112.2 with doping concentration or density of $10^{17}$ acceptor atoms/cm$^3$, and a high doped n+ region 112.1 with doping density $10^{20}$ donor atoms/cm$^3$. The width of a depletion region 116 is about 400 nm at breakdown. The carrier concentrations are the values needed for an approximate $10^3$ A/cm$^2$ current density. The breakdown voltage of this device is in the order of 12V.

FIG. 10(a) depicts the electric field profile in the junction depletion region 116 at breakdown. FIG. 1(b) shows the ionization coefficient of the electrons in the depletion region 116. From these two figures it is evident that carriers will only experience impact ionization over a short distance within the depletion region 116. The low electric field remote from the junction 114 also means that hot energetic carriers are only present near the n⁺ side of the depletion region, and that holes leaving the depletion region 116 near the p side will be low energy carriers.

FIG. 10(c) shows the carrier concentration profiles in the depletion region 116, and FIG. 1(d) exhibits the p*n carrier product. If the carrier recombination rate is proportional to the product pn of the hole p and the electron n concentrations in the depletion region 116, then carrier recombination will occur in a short region of the depletion region only.

It is believed that with the device 10 according to the invention shown in FIGS. 1 to 9, the internal quantum efficiency of photon generation may be improved, more particularly by using the reach through effect. The internal quantum efficiency (number of photons generated per electron) is enhanced if more carrier-to-carrier or carrier-photon interactions can take place in the same volume. Improved power efficiency (optical power out vs. electrical power in) can also be achieved if the devices can be operated at lower operating voltages.

Referring now to FIGS. 11(a) to (d), in the device 10 according to the invention, a region 12.3 of high doping with the same polarity as the lightly doped region 12.2, is placed in close proximity to the reverse biased n⁺p junction 18. There is hence formed a n⁺pp⁺ doping profile. When the junction 18 is reverse biased, the depletion region 18.1 spreads mainly into the lightly doped p region 12.2. If the depletion region reaches the p⁺ region 12.3 before breakdown has taken place, the junction will be in the reach through mode of operation. A further increase in reverse voltage will cause the depletion region to spread into the p⁺ region 12.3, causing breakdown without too much further increase in the reach through voltage. FIG. 11(a) shows the reach through n⁺pp⁺ device with the acceptor doping $N_A=10^{16}/cm^3$ in the p region 12.2, and the spacing between the n⁺ region 12.1 and the p⁺ region 12.3 equal to 400 nm. This was done to compare the reach through device 10 with a 400 nm depletion region to a conventional n⁺p device 110 with the same depletion region width and referred to hereinbefore.

In the reach through mode, the electric field (see FIG. 11(a)) is relatively high and almost constant throughout the entire depletion region 18.1. This means that the ionization coefficient is also relatively constant across the whole depletion region 18.1, as indicated in FIG. 11(b). The breakdown voltage can be determined from the electric field profile and is also approximately 12V.

This reach through device 10 ensures that the carriers traversing the depletion region 18.1 remain "hot" (high energy carriers) throughout the entire depletion region, up to the point where they leave the depletion region. Furthermore, avalanche impact ionization events are expected to take place throughout substantially the entire depletion region 18.1.

Another advantage of this type of reach through device 10 is that the carriers move at the carrier saturation velocity through the entire depletion region 18.1, due to the high electric field throughout the depletion region 18.1. This is expected to make the reach through device carrier transit time less than that of the conventional diode, and thus increase the switching speed of the light generation process.

In FIG. 11(c) there is shown the carrier concentration profiles for the n⁺pp⁺ reach through device 10. The electron concentration in the depletion region 18.1 is higher than in the conventional device, and with the higher ionization coefficient of electrons compared to holes, more impact ionization events may occur.

FIG. 11(d) depicts the carrier concentration product n*p. It is evident that the carrier concentration product p*n is significantly higher for most regions in the depletion region 18.1 when compared to the conventional device 110. If an integral of the p*n product is taken over the whole length of the depletion region, a significant higher integrated p*n product is achieved compared to the conventional n⁺p device. Hence, one may expect a higher radiative carrier recombination rate in the reach through device 10 at the same current density and breakdown voltage compared to the conventional device.

The reach through device 10 may have a faster switching speed and may provide the ability to adjust the breakdown voltage to lower or higher values by varying the distance between the n⁺ and p regions. Decreasing the n⁺ to p⁺ distance reduces the breakdown voltage.

The invention claimed is:

1. A light emitting device comprising:
a first body of a semiconductor material;
a junction in the first body formed between a first region of the first body and a second region of the first body, the first region being of a first doping kind of a first concentration and the second region being of a second doping kind of a second concentration;
the first body comprising a third region of the second doping kind of a third concentration, and being spaced from the first region by the second region, so that the second region is sandwiched between the first region and the third region;
a second body of an isolation material immediately adjacent at least part of the second region, the second body at least partially encapsulating the first body, so that when the device is viewed in transverse cross section, the second body at least partially borders spaced sides of the second region of the first body, or at least partially encircles at least part of the second region of the first body;
a terminal arrangement connected to the first body and arranged to reverse bias the junction into a breakdown mode; and
the device being configured such that a depletion region associated with the junction extends through the second region of the first body and reaches the third region of the first body, before the junction enters the breakdown mode.

2. A light emitting device as claimed in claim 1 wherein the first and third doping concentrations are higher than the second doping concentration.

3. A light emitting device as claimed in claim 1 wherein the second body encircles the junction and at least part of the second region of the first body.

4. A light emitting device as claimed in claim 1 wherein the first body is wholly encapsulated by the second body.

5. A light emitting device as claimed in claim 1 wherein the semiconductor material is an indirect bandgap semiconductor material.

6. A light emitting device as claimed in claim 5 wherein the indirect bandgap semiconductor material comprises silicon.

7. A light emitting device as claimed in claim 1 wherein the insulating material comprises silicon dioxide.

8. A light emitting device as claimed in claim 1 wherein the first doping kind is n and the second doping kind is P.

9. A light emitting device as claimed in claim 1 wherein the first doping kind is p and the second doping kind is n.

10. A light emitting device as claimed in claim 1 wherein the terminal arrangement is connected to the first region of the first body and the third region of the first body only.

11. A light emitting device as claimed in claim 1 having a lateral layout with the first, second and third regions of the first body laterally in line and all adjacent a light emitting wall of the device.

12. A method of generating light comprising the steps of:
   providing a device comprising a first body of a semiconductor material having a junction formed in the body between a first region of the body and a second region of the body, the first region being of a first doping kind of a first concentration and the second region being of a second doping kind of a second concentration, the first body comprising a third region of the second doping, kind of a third concentration spaced from the first region of the first body by the second region, so that the second region is sandwiched between the first region of the first body and the third region of the first body; and a second body of an isolation material immediately adjacent at least part of the second region, the second body at least partially encapsulating the first body, so that when the device is viewed in transverse cross section, the second body at least partially borders spaced sides of the second region of the first body, or at least partially encircles at least part of the second region of the first body; and
   providing a terminal arrangement connected to the first body to reverse bias the junction, such that a depletion region associated with the junction extends through the second region of the first body and reaches the third region of the first body, before the junction enters the breakdown mode.

13. A method as claimed in claim 12 wherein the junction is reverse biased by applying a biasing voltage to the first region of the first body and the third region of the first body.

14. A method as claimed in claim 12 wherein the semiconductor material comprises an indirect bandgap semiconductor material.

15. A method as claimed in claim 14 wherein the indirect bandgap material comprises silicon.

* * * * *